United States Patent [19]

Ferro et al.

[11] 3,786,264

[45] Jan. 15, 1974

[54] HIGH SPEED LIGHT DETECTOR AMPLIFIER

[75] Inventors: Armand P. Ferro; John D. Harnden, Jr.; Bruno F. Kurz, all of Schenectady, N.Y.

[73] Assignee: General Electric Company, Schenectady, N.Y.

[22] Filed: Jan. 2, 1973

[21] Appl. No.: 320,568

[52] U.S. Cl. ...... 250/214 R, 250/211 J, 317/235 N, 307/117

[51] Int. Cl. ........ H01j 39/12

[58] Field of Search ........ 250/206, 214, 211 J; 307/311, 117; 317/235 N

[56] References Cited

UNITED STATES PATENTS

| | | | |
|---|---|---|---|
| 3,450,888 | 6/1969 | Spangler | 250/214 X |
| 3,534,351 | 10/1970 | Harnden, Jr. et al. | 307/311 X |
| 3,535,532 | 10/1970 | Merryman | 317/235 N X |
| 3,626,825 | 12/1971 | Years | 250/211 J X |
| 3,739,178 | 6/1973 | Chow | 250/214 X |

*Primary Examiner*—Walter Stolwein
*Attorney*—Donald R. Campbell, Joseph T. Cohen and Jerome C. Squillaro

[57] ABSTRACT

A light detector amplifier preferably fabricated as a monolithic integrated circuit has high speed of response (in the order of 1 microsecond) at low and high illumination levels, uses low quiescent power and supply voltage, and has an optional thyristor or power transistor output. A transistor preamplifier conducts in the quiescent state and reverse biases a photodiode. Upon illumination, current is diverted to the photodiode and a power amplifier is energized to produce an output which can also provide gating current for a thyristor output. Enhanced performance is obtained by the use of special components, and unique placement of components within the circuit. Voltage excursions are limited in the circuit at several points by current steering, pre-biasing and diode clamping techniques.

16 Claims, 10 Drawing Figures

HIGH SPEED LIGHT DETECTOR AMPLIFIER

BACKGROUND OF THE INVENTION

This invention relates to a high speed solid state light detector amplifier, and more particularly to an integrated high speed photodetector with either a thyristor pulse output or a transistor output.

Although a variety of photodetector devices and circuits are available, there is a need for a photodetector that operates at high speed with a wide range of illumination levels while yet having sufficient gain and high output current capability to cover a broad range of user applications. Devices with gain such as the phototransistor are highly nonlinear and have a relatively slow response, whereas devices that are fast such as the ordinary photodiode do not possess any gain. The gain characteristic is improved by the combination of a photodetector device with amplifier circuit elements, especially in integrated circuit form. However, known light detector amplifiers have one or more limitations including relatively slow response (10 kHz), slowed response as the light level increases, or low output current capability.

A large class of applications for photodetectors requires a power pulse current output such as is obtained from a silicon controlled rectifier (SCR). However, a light sensitive SCR designed for fast response has extremely poor dv/dt performance, a serious handicap in dc circuits as well as with power level voltages. Another group of photodetector applications relates to battery energized light detector circuits for a wide range of uses. To avoid replacing the dry cell batteries too frequently, it is essential to have low standby power consumption ideally approaching the shelf life of the batteries. The present invention is directed to a new and improved light detector amplifier that operates at high speed (greater than 500 kHz) at both low and high illumination levels, with the optional capability of a power pulse SCR output and low energy battery operation. In its preferred form it is fabricated as a monolithic integrated circuit.

SUMMARY OF THE INVENTION

In terms of its circuit configuration, the light detector amplifier constructed in accordance with the invention comprises a preamplifier circuit that conducts in the quiescent state and reverse biases a semiconductor photodiode. In a modified Darlington transistor amplifier the photodiode is connected between the base and emitter of the first and last devices, the first being operated in the linear region. Current source and voltage clamping circuit means supplies current to the preamplifier circuit which is diverted to the photodiode when illuminated by incident light. Voltage excursions are limited at the high impedance junction of the photodiode, current source, and preamplifier. A power amplifier circuit is connected to be energized by the change of conductivity or change of state of the preamplifier and produces an output indicative of sensed light. The power amplifier optionally generates sufficient gate current to turn on a thyristor device connected to a higher supply voltage which generates a higher power output. Typically, the power amplifier is a transistor amplifier and the thyristor device is an SCR, although other appropriate devices can be employed in place of the SCR. High speed operation under low and high illumination levels is achieved by limiting voltage excursions at critical curcuit points by utilizing current steering, diode clamping, and by pre-biasing selected devices. Charge storage is minimized in selected devices by linear operation or Schottky barrier diode clamping.

Circuit performance is enhanced by using high performance special components. These include a split collector transistor in the current source, Schottky diode clamped transistors, a high speed field- aided lateral transistor, a specially constructed photodiode sensor, and a highly emitter shorted lateral SCR. The integrated photodetector has response times comparable to the speed of light emitting semiconductor diodes. While most advantageously it is fabricated by planar diffusion technology on a single chip, it can also be employed in hybrid integrated circuit form or made with discrete components.

DESCRIPTION OF THE PREFERRED EMBODIMENTS

Figure 1:
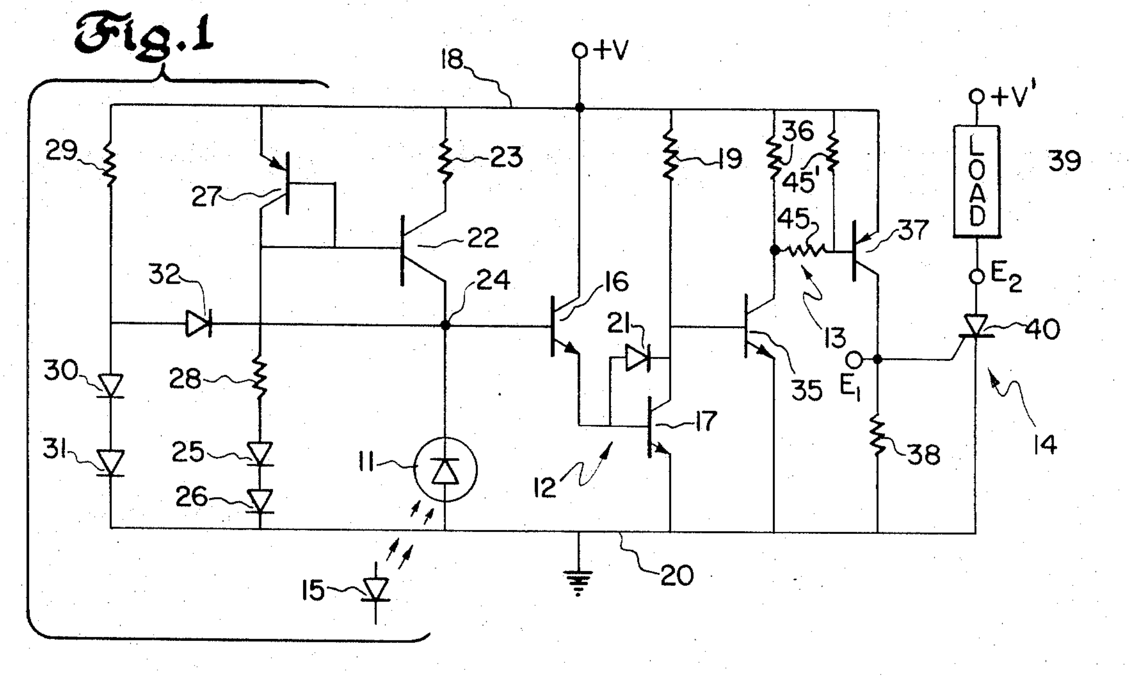
FIG. 1 is a detailed schematic circuit diagram of the high speed light detector amplifier using a reverse biased photodiode, with provision for either a transistor output or power pulse SCR output.

The light detector amplifier shown in FIG. 1 operates in on-off threshold mode and is suitable for detecting very fast incident light pulses with a time duration of one microsecond or less emitted by a light emitting diode or other photoemitter. The circuit to be described uses a three volt battery and requires a quiescent current of 0.5 milliamperes. Using two D size dry cells, the batteries are good for a period of time equal to their shelf life (about one year) even when the circuit operates continuously. Typical applications for such a photodetector amplifier are in the consumer and commercial fields, such as an intrusion alarm, a smoke detector, a photoelectric relay, a pulse mode counter, an SCR gate drive, etc. The first three are described generally in U.S. Pat. No. 3,534,351, granted Oct. 13, 1970 to J. D. Harnden, Jr., D. L. Watrous, and C. M. Jones, and assigned to the same assignee. Depending on the application, another voltage source at a different low voltage level may be appropriate. The circuit is fabricated with discrete components or as a hybrid integrated circuit, but the principles are applicable generally to fabrication in monolithic form.

Figure 2:
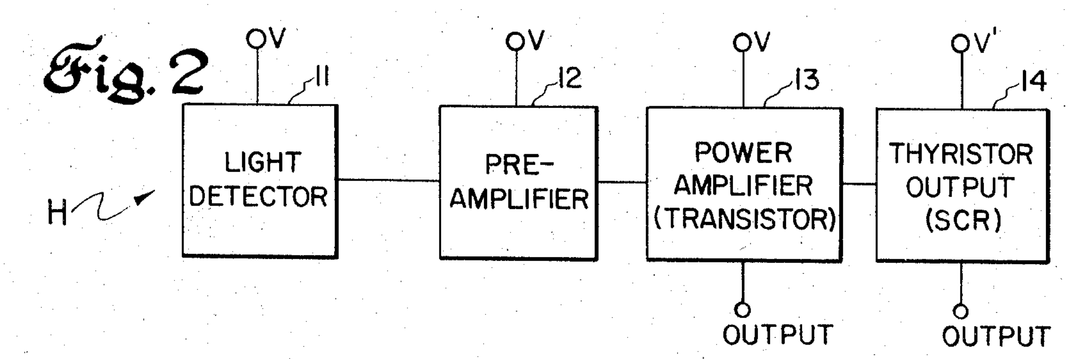
FIG. 2 is a simplified block diagram of the main functional components of the new photodetector.

A novel feature of the high speed integrated photodetector is that a reverse biased semiconductor photodiode is connected between base and emitter of a transistor preamplifier stage which is conducting in the quiescent condition of the circuit. Further, this preamplifier is a modified, Schottky clamped Darlington stage to virtually eliminate stored charge in the first stage. In terms of the general functional block diagram of FIG. 2, photo energy H incident on the semiconductor light detector 11 initiates a current steering action that causes the transistor preamplifier 12 to change from the conducting to a reduced conductivity condition, similar to switching to the non-conducting state. This in turn, also by a current steering mechanism, energizes transistor power amplifier 13 and generates a proportional time base digital power output signal. Optionally, power amplifier 13 can provide a gating signal for a thyristor 14 which may be connected to a higher voltage source (for example, 50 volts) and generates a higher current output (for example, four amperes). High speed operation is obtained by limiting the internal voltage excursions to a few hundred millivolts. Voltage excursions are restricted by utilizing current steering, and also by pre-biasing the transistors, and diode clamping of the potential at cirtical circuit points. The use of some special semiconductor devices in the preferred circuit implementation also contributes to the high speed performance.

Referring to FIG. 1, semiconductor photodiode 11 is suitably a silicon device made by planar technology and is sensitive to incident light energy in a selected portion of the visible or infrared spectrum. The speed of response of a silicon photodiode is compatible with that of a light emitting semiconductor diode 15 incorporated in a transmitting circuit or transmitter unit, not here shown. These photoemitters are relatively inexpensive and are characterized by a very fast response time, typically 0.1 microsecond. The two photo devices 15 and 11, of course, are matched to be operative at the same wavelengths. It is desirable to employ the low capacitance "finger" photodiode illustrated in FIGS. 6 and 7, which will be described in detail later. Whereas conventional photodiodes have a single diffused p-region, the new photodiode has multiple p-regions that are elongated and parallel to one another in a finger-like structure. The circuit is improved by the use of this low capacitance photodiode at the circuit input. A novel feature of this circuit in integrated circuit form is the placement of the photodiode such that the anode is at ground potential. This allows parallel operation of the concurrent substrate photodiode formed by the n-epitaxial layer and p-type substrate. This placement improves carrier collection efficiency of an epitaxial photodiode and therefore improves speed of response at a given input light intensity.

Transistor preamplifier 12 is more particularly a modified Darlington amplifier comprising a first transistor 16 operated in the linear region and a second transistor 17 operated in the saturated region. Instead of being connected together, the collector of transistor 16 is connected directly to positive low voltage dc terminal 18 while the collector of transistor 17 is connected through resistor 19 to terminal 18. The emitter of transistor 16 supplies base drive current to transistor 17, whose emitter is connected to negative low voltage dc terminal 20. Terminals 18 and 20 are supplied by the low voltage source +V (the 3 volt battery). To prevent full saturation of transistor 17, it is desirable to use a special component incorporating a Schottky diode clamp 21 connected between its base and collector. Diode 21 becomes conductive when ever collector potential drops below that of the base. Semiconductor photodiode 11 is connected between the base of transistor 16 and terminal 20, which is preferably at ground potential or other lowest circuit potential, and thus in the quiescent state of circuit is back-biased by $2V_{BE}$.

Base drive current for transistor 16 is continuously supplied in the quiescent state of the photodetector circuit by a constant current source that includes at least one lateral pnp transistor 22. A resistor 23 is connected between positive dc terminal 18 and the emitter of transistor 22, while the collector is connected directly to the base of transistor 16 and also to the cathode of photodiode 11. The common junction is hereafter identified as the high impedance junction point 24, since for a three volt source and a typical value of base drive current of one microampere supplied by the collector of transistor 22, the impedance at point 24 is in the megohm range. Base drive current for transistor 22, which conducts continuously, is preferably supplied by a second transistor 27 connected as a diode by joining together the base and collector electrodes. The emitter of device 27 is connected to terminal 18, the base to the base of transistor 22, and the joined multiple collectors are returned through a resistor 28 and a pair of series connected diodes 25 and 26 to terminal 20. Transistors 22 and 27 are desirably identical devices to obtain matched electrical properties.

An additional voltage clamping and current source circuit is required for proper operation of the light detector amplifier when it changes from the quiescent to the active state upon the sensing of incident light. This circuit includes a resistor 29 and a pair of diodes 30 and 31 connected between terminals 18 and 20, and an additional diode 32 connected between high impedance junction point 24 and the junction of resistor 29 and diode 30. Accordingly, both the anode and cathode of diode 32 are about two diode drops above ground, and preferably diode 32 is slightly conductive in the quiescent state by slightly raising the voltage at the anode or by properly choosing the areas of the diode devices in this circuit. When the photodiode conducts in response to sensing light, the potential at point 24 is reduced and diode 32 conducts logarithmically. After transistor 16 turns off, diode 32 provides charging current from a low impedance source to charge the capacitance at point 24 including that of the photodiode and the transistor base-emitter junction.

Figure 9:
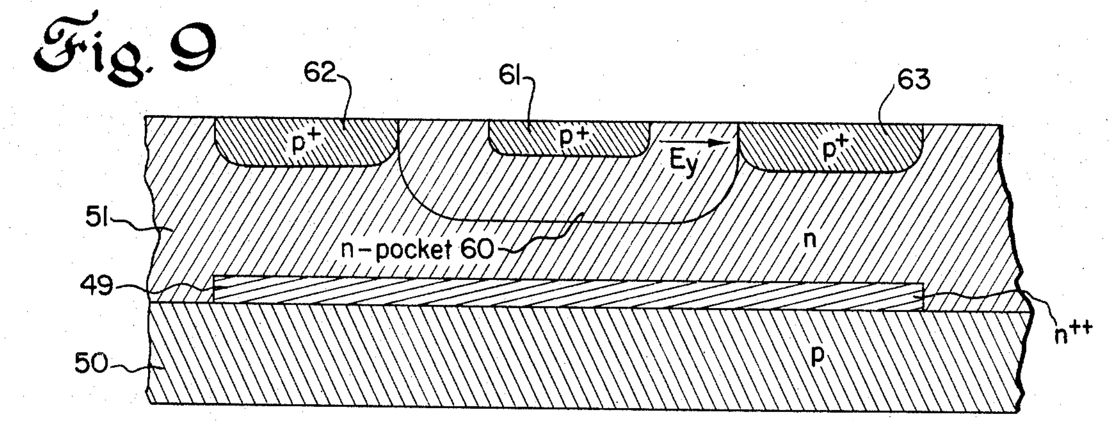
FIG. 9 is a cross-sectional view of a field-aided lateral pnp transistor with an improved cutoff frequency and high density current performance.

At the output side of the integrated photodetector, the normally non-conducting transistor power amplifier 13 by way of example includes an npn transistor 35 and a pnp transistor 37 from whose collector the output signal $E_1$ is taken. The base of transistor 35 is connected directly to the collector of transistor 17, the emitter to negative terminal 20, and the collector is connected through resistor 36 to positive terminal 18. When transistor 17 turns off or has reduced conductivity in response to the sensing of light, the current flow through resistor 19 is diverted to the base of transistor 35, turning it on. The voltage excursion at the collector of transistor 17 is desirably no more than a few hundred millivolts to obtain high speed at low light levels. To obtain sufficient gate drive current to turn on an SCR, a high current field-aided lateral pnp transistor 37 is included. This special component shown in FIG. 9 is characterized by a resistivity graded base region to obtain a higher cutoff frequency and improved high current density capability. The base is connected to the collector of transistor 35 through a resistor 45, the emitter to terminal 18, and the collector through a resistor 38 to terminal 20. An additional resistor 45' is provided between the base and terminal 18 to permit fast turn off. When transistor 35 conducts, bias for field-aided lateral transistor 37 is obtained by the drop across resistor 36 in parallel with resistors 45 and 45', rendering it conductive and generating a gating signal across resistor 38.

Pulse generator circuit 14 is energized by the higher voltage source +V'. Basically, by way of example, the circuit includes a dc load 39 in series with an SCR 40, or can be an ac load supplied by a bidirectional conducting thyristor such as a triac. The gate and cathode of SCR 40, of course, are connected across resistor 38, while the higher power output $E_2$, which can be a d-c voltage or a current pulse, is taken at the anode of the device. The gate of the SCR is protected by a small series resistor. SCR 40 is preferably the highly cathode-gate shorted lateral device shown in FIG. 10, which has high dv/dt withstand capability to provide noise immunity and high current pulse capability. The gate of SCR 40 is protected by a small series resistor 38'. It can also be a very high power discrete transistor for purposes of greater amplification, i.e., a 5–10 ampere output.

The operation of the integrated photodetector, which has a high speed response under both low and high incident light intensities, will now be reviewed. The low light intensity is assumed to be at least one milliwatt/centimeter$^2$ to obtain fast turn on response with a given photodiode area and bias current in the base of transistor 16. In the quiescent condition of the circuit, transistors 27 and 22 in the constant current source are conducting, as are the preamplifier stage transistors 16 and 17. The power amplifier transistors 35 and 37 are non-conducting, although it is desirable that transistor 35 and also possibly transistor 37 have a small leakage current to facilitate fast turn-on. The collector of transistor 22 supplies approximately two microamperes of base drive current to transistor 16. Diode 32 is also slightly conductive and desirably supplies an additional 10 percent or so of base drive current to transistor 16, i.e., about 0.2 microampere. Semiconductor photodiode 11 is reverse biased by about two diode drops with the potential at high impedance junction point 24 being about 1.2 volts. Accordingly, the photodiode in the dark stat diverts no current from the base of transistor 16.

Under light exposure by a pulse of light from light emitting diode 15, the generated photocurrent in photodiode 11 lowers the photodiode reverse voltage. The base current of transistor 16 is diverted through the lowered impedance path provided by the light sensitive photodiode. Additional current is provided by the storage charge of the base-emitter diode of transistor 16, and an even greater amount is derived from the resistor 29-diode 32 path. The circuit parameters are selected such that at low incident light intensities there are about ten microamperes of current through the illuminated photodiode 11. Thus, there is positive, fast, reduction of current in transistor 16 similar to switching states, facilitated by its operation in the linear region, which in turn reduces the base current of transistor 17 so that it also has reduced conductivity and tends to turn off. In addition to the current steering at high impedance junction point 24, from the base of transistor 16 to photodiode 11, the magnitude of the voltage excursion at this point is clamped by the circuit comprising resistor 29 and diode 32. High incident light intensities tend to cause a photocurrent much greater than that being supplied by the constant current source, with the tendency for the voltage of the photodiode to reverse polarity. This is prevented within defined limits by increased conduction of current through resistor 29 and diode 32. This input clamping to allow voltage excursions no greater than several hundred millivolts allows more uniform frequency response over a wider range of input light levels. Therefore, fast turn-on of transistor 16 is obtained when the incident light is removed even at high levels of illumination.

Upon the change of conduction state of transistor 17 from heavy to reduced conduction, the collector current is diverted to the base of power amplifier transistor 35, turning it on. As was mentioned, voltage excursions at this point are also limited to a few hundred millivolts by the use of special Schottky diode clamped transistor 17. As was previously explained, field-aided lateral transistor 37 also is rendered conductive. The digital output voltage $E_1$ with a proportional time base corresponding to the light sensing interval is taken at the collector of transistor 37. In this circuit, transistor 37 conducts and supplies gate current to lateral SCR 40, turning it on to produce a higher power pulse output $E_2$. With properly chosen components and circuit parameters, the total delay or circuit response time to produce the pulse output is less than one microsecond.

Figure 3:
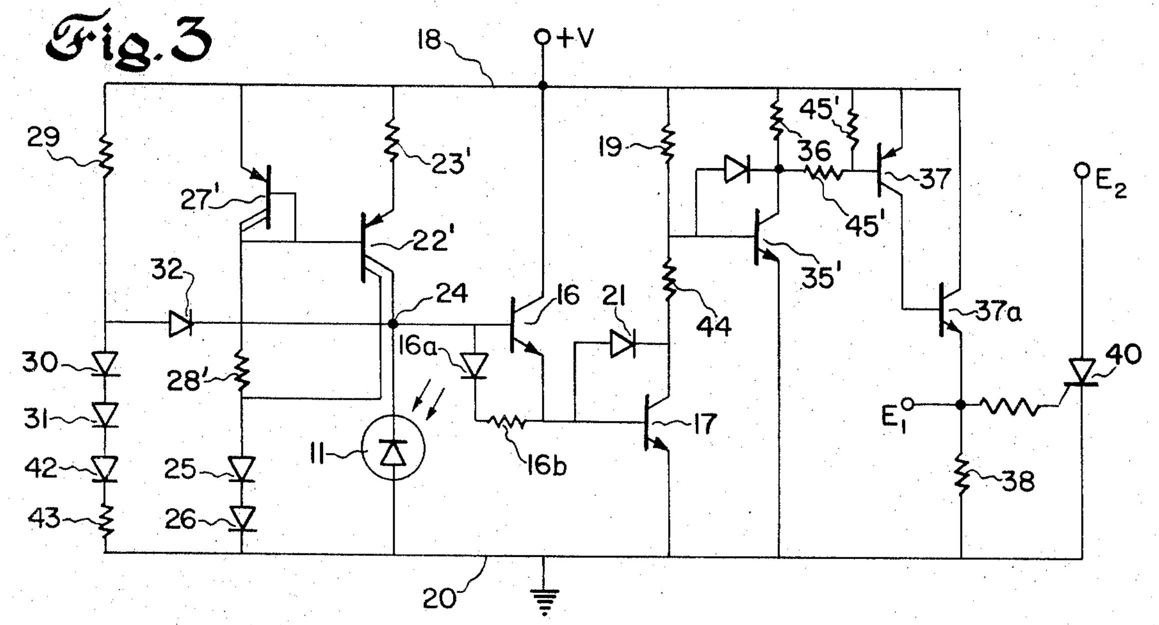
FIG. 3 is a detailed circuit diagram of the preferred embodiment of the invention, and is a modified version of the FIG. 1 circuit.
Figure 4:
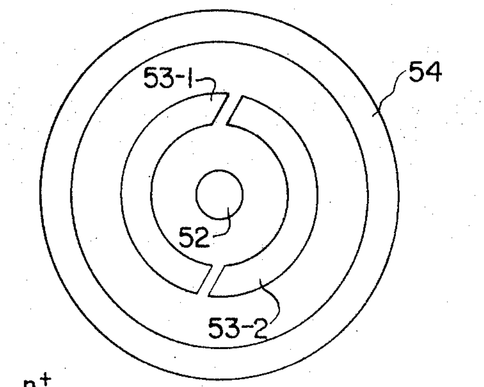
FIGS. 4 and 5 are plan and cross-sectional views, respectively, of the split collector transistor employed in the constant current source shown in FIG. 3 suitable for monolithic implementation.
Figure 5:
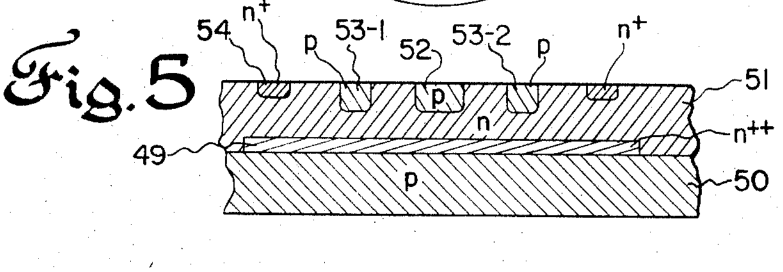

A modified circuit illustrated in FIG. 3 is the preferred embodiment for monolithic integrated circuit implementation. The conventional transistor 22 in the constant current source in FIG. 1 is replaced by a lateral split collector transistor 22' having a pair of isolated collectors. The values of resistors 23' and 28', to obtain a collector current of one microampere, are considerably lower than the values of resistors 23 and 28 in FIG. 1. As can be seen in FIGS. 4 and 5, this special component has a plurality of isolated collector regions such that each one collects a fixed percentage of the total current depending on the geometry of the device. With this structure, very low values of current can be obtained with reasonable values of diffused resistors 23' and 28'. The first collector is connected directly to the base of transistor 16 and also to the cathode of photodiode 11. The second collector is coupled through the pair of series connected diodes 25 and 26 to negative terminal 20. Thus, both collectors in the quiescent state are about two diode drops above ground. Base drive current for transistor 22', which conducts continuously, is preferably supplied by a second lateral split collector pnp transistor 27' connected as a diode by joining together the base and both collector electrodes. The joined multiple collectors are returned through resistor 28' and diodes 25 and 26 to terminal 20.

In the voltage clamping and current source curcuit there is inserted in series with diodes 30 and 31 an additional Schottky diode 42 which has a lower forward voltage drop than a silicon pn diode. Accordingly, the anode potential of diode 32 is such that it is closer to the conducting state. Another fine technique for obtaining a precise control for the anode voltage of diode 32 for ultra fast response is to insert a pair of small resistors 43, only one of which is shown, in series with diodes 30, 31 and 42. This is a versatile adjustment tool for controlling the voltage at the anode of diode 32 and compensates for process variations. To further enhance the speed of response of the circuit, transistor 16 should have a relatively low current gain. This is accomplished by clamping the base-emitter by means of a silicon diode 16*a*- resistor 16*b* series network. This network diverts base current of transistor 16 and helps to turn it off especially under heavy illumination. To more precisely regulate the voltage at the base of transistor 35', an additional resistor 44 is inserted in series with resistor 19 with the base being connected to their junction rather than directly to the collector of transistor 17. The voltage excursions at the collector of transistor 35' are further limited by using a Schottky diode clamped device similar to transistor 17. In the transistor power amplifier, it is further noted that the transistor 37 and an additional transistor 37*a* connected in the Darlington amplifier configuration are provided for greater gain. In view of the obvious similarity to FIG. 1, no further description of the operation of the FIG. 3 photodetector is necessary. The output voltage $E_1$ in this circuit is taken off the emitter of transistor 37*a*.

Because of the low stand-by power requirements, great flexibility is possible as to the power supply required for the integrated photodetector. For example, simple resistive voltage dividers should prove practical since the total losses, even from a supply of 1000 volts, do not exceed one watt. Such may be the case when used as an SCR gate driver where the voltage divider is connected to the anode of the SCR which is in a high power circuit. In an ac circuit, a simple diode, resistor, and filter capacitor may provide the necessary power supply. In place of a conventional diode, metallization changes can be made to allow access to this diode function within the chip itself. Also, the chip can include a built-in voltage supply regulator, such as a Zener diode with a series resistor or a series transistor type voltage regulator.

The special semiconductor devices illustrated in plan view or cross section in FIGS. 4–10 enhance the performance of the integrated photodetector, but are not essential within the broader scope of the invention or can be used in different combinations. They will not be described in great detail since it is believed that a person skilled in the art will understand their construction and operation from the drawings and the description given. It will be recalled that the entire circuit shown in FIG. 3, including the lateral SCR 40, can be formed on a single monolithic integrated circuit chip. The circuit can be fabricated by standard planar diffusion technology on a p-type silicon substrate which may have an overlying heavily doped $n^{++}$ buried layer, as well as an n-epitaxial layer in which these devices are formed. The same elements in the several figures are designated by same numerals and will not be repeated; further, two of the components are described in greater detail in prior filed or currently filed applications.

The split collector lateral pnp transistor 22 used in the constant current source is shown in FIGS. 4 and 5. As with most of these devices, the buried $n^{++}$ layer 49 and p-type substrate 50 are provided with an epitaxially grown n-layer 51. The device has a single circular emitter 52 in the form of a centrally lcoated p-diffusion. The two physically isolated collector regions 53–1 and 53–2 are p-diffusions in the form of semicircular rings at the same distance from the emitter in a symmetrical arrangement. The ring-shaped base contact 54 encircles the whole and is a heavily doped n-diffusion. In this geometry with two semicircular, symmetrical collectors, each collector carries 50 percent of the total emitted current. As a variation, one collector can have an angular length of 120°, and the other a length of 240°. In this case, the individual collector currents have the ratio of 2:1. A square, symmetrical geometry is also possible using a square emitter and four separate linear collectors, each located on a side of the square. In this case, the current is split by the ratio 3:1.

Figure 6:
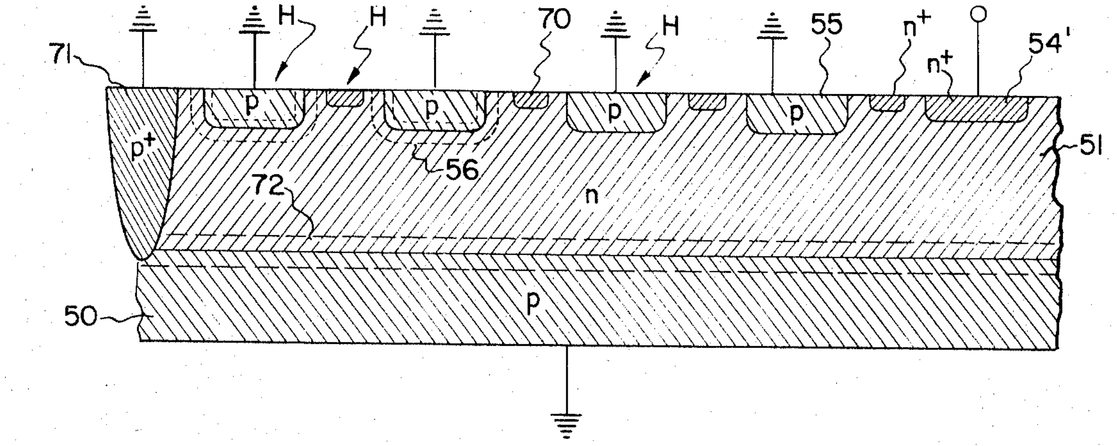
FIGS. 6 and 7 are cross-sectional and plan views, respectively, of the low capacitance finger photodiode that is preferably used.
Figure 7:
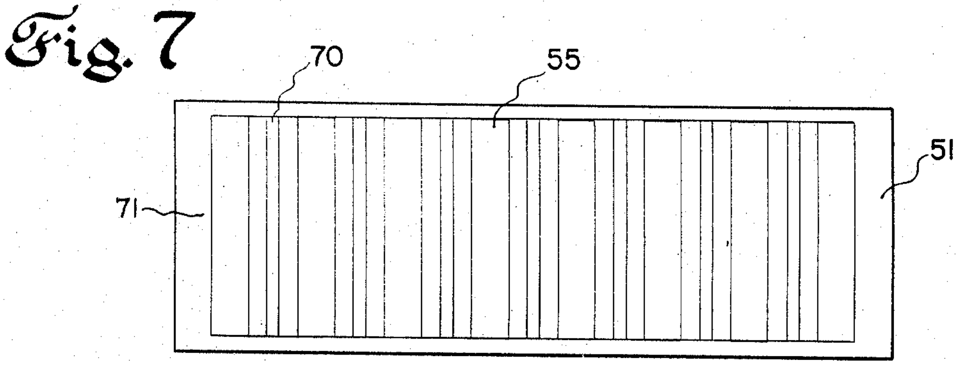

The low capacitance "finger" photodiode is illustrated in FIGS. 6 and 7. This structure features a plurality of physically isolated, elongated, parallel p-regions or strips 55, each of which forms a light sensitive pn junction with the underlying n-epitaxial layer 51. At one side is a heavily doped n-region for the cathode contact 54', which makes connection with the epitaxial n-layer 51. The isolated regions are, of course, connected together by a common contact which is at ground potential in the circuit connection. Interleaved with the p-regions at the surface of n-layer 51 are alternate $n^+$ diffusions 70 which function to prevent surface recombinations. Diffusions 70 are similar in shape to p-regions 55 and form a grating structure therewith. Although illustrated at one side only, there are at both sides of the device a deep $p^+$ diffusion or isolation region 71 extending from the surface into substrate 50. In a photodiode, the capacitance of the device is determined by the width of the depletion layer and by the area of the device. By back-biasing the pn photodiode, as is done in this circuit, the capacitance is minimized since the depletion layer is widest. The depletion layer boundaries on both sides of a pn junction are indicated at 56 in the figure. By using a finger or strip-like structure for the p-regions 55, the area and thus the capacitance of the device is reduced. The criterion for spacing the individual fingers is that the separation is less than the diffusion length of the carriers. The photo energy H is incident upon the p-regions 55 and also upon the surface of n-layer 51 and $n^+$ diffusions 70 between these regions. To collect the carriers created by the absorbed photon energy in the space between p-regions 55, this spacing is less than the diffusion length. This enhances the efficiency of the photodiode. A second reverse-biased light sensitive np diode, electrically in parallel with the first, is formed by n-layer 51 and p-substrate 50. Carriers collected in the depletion layer, whose boundaries are indicated at 72, are collected by the isolation regions 71, further enhancing the efficiency of the photodiode. This allows high diode efficiencies with relatively thin epitaxial layers having a thickness less than the absorption coefficient of the wavelength of incident light for which the device is suitable. For example, at 9000°A epitaxial layer 51 is 15 microns thick for an absorption coefficient of 28 microns (32 percent of the light goes beyond 28 microns before absorption). For further information, reference may be made to the concurrently filed application by Bruno F. Kurz and Armand P. Ferro, Ser. No. 318,388 filed Dec. 26, 1972 and assigned to the same assignee.

Figure 8:
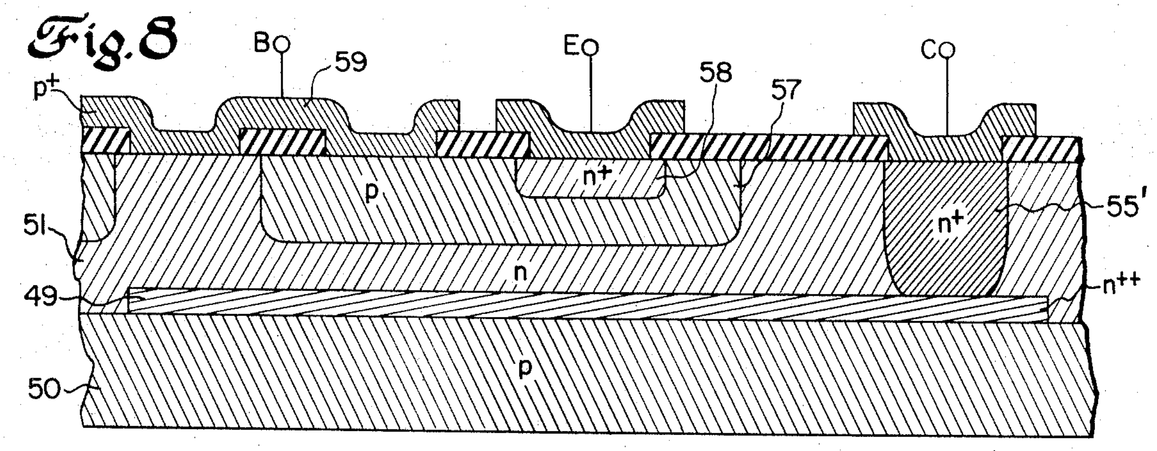
FIG. 8 is a cross section through an npn transistor with Schottky diode clamping to limit collector stored charge and collector voltage excursions.

FIG. 8 shows the Schottky diode clamped npn transistor 17. The vertical npn structure is clearly evident. The emitter contact is made to n-region 58, the base contact to the p-region 57, and the collector contact to the heavily doped connection region 55' and n-layer 51. The base contact metallization 59, preferably of aluminum, is extended beyond the opposite side of the p-region 57, and makes contact to the surface of the exposed n-layer 51. Since the aluminum metallization is $p^+$ material, a Schottky diode is formed between the metallization 59 and the underlying n-layer 51. Electrically these have the connection shown in FIG. 1, in which the Schottky diode clamp connects the base and collector of the device. This connection not only limits the degree of saturation of the vertical npn transistor, but also reduces the storage charge by preventing heavy forward biasing of the base-collector junction.

The high speed field-aided lateral pnp transistor shown in FIG. 9 is described in detail in application Ser. No. 308,324, by Bruno F. Kurz, filed Nov. 21, 1972, and assigned to the same assignee. Briefly, this structure includes an additional lower resistivity n-pocket 60 diffused into the surface of the n-epitaxial layer 51. The heavily doped p-type emitter region 61 is diffused centrally into the surface of the n-pocket 60, while the collector regions 62 and 63 are diffused into the surface of n-layer 51 at either side of the n-pocket. The curving sides of the n-pocket provide a graded resistivity base region for each lateral transistor which creates a drift electric field $E_y$ that aids the transport of carriers from the emitter to an adjacent collector. Further, the collector regions diffuse deeper than the emitter region, helping to collect carriers that are non-parallel to the surface. This structure has a narrow base width, and achieves improved cut-off frequency, high current density performance, and linearity of current gain.

Figure 10:
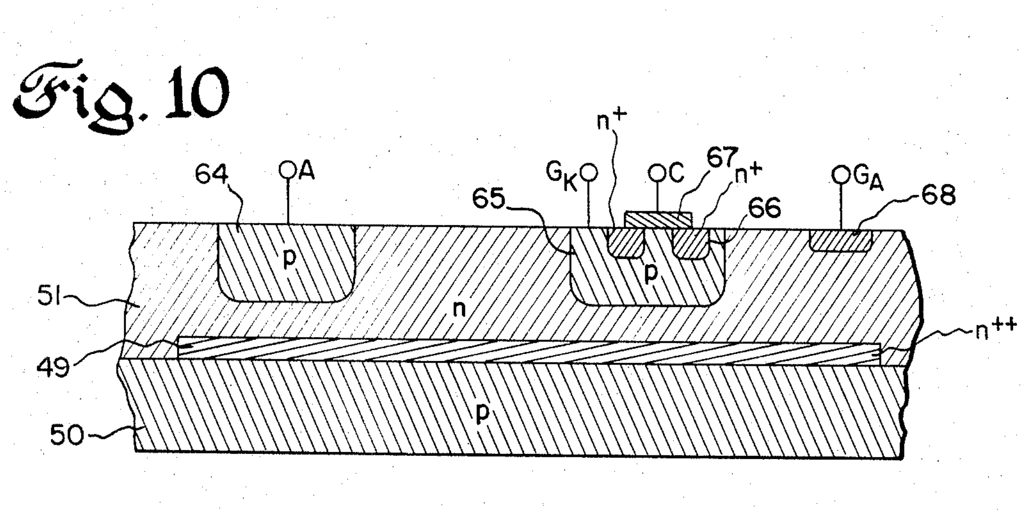
FIG. 10 is a cross-sectional view of a highly emitter shorted lateral SCR with high dv/dt withstand capability.

The lateral SCR shown in FIG. 10 has localized cathode-gate shorts which are the key to the very high dv/dt capability. In this lateral pnpn structure, the anode connection is to the p-region 64, the gate connection $G_K$ is to the p-region 65, and the cathode connection is to the hollow square heavily doped n-type region 66. The structure can also include a contact region 68 in n-layer 51 for an anode gate connection $G_A$. The cathode-gate (or base-emitter) short is provided by the metallization 67 which bridges opposite sides of the hollow square n-region 66, making connection to the surface of the p-region 65 therebetween. With this short connection, only at high current densities can the current gain be increased sufficiently to fulfill the firing condition.

In summary, the new light detector amplifier achieves high speed response over a wide range of input light levels, has low power requirements, but yet can produce sufficient gating current for a thyristor output. Although preferably fabricated as a monolithic integrated circuit, the circuit principles and special high performance components are also applicable to hybrid and discrete packaging. The photodetector has a variety of applications including counters, SCR gate drivers, consumer and commercial battery operated apparatus, etc.

While the invention has been particularly shown and described with reference to several preferred embodiments thereof, it will be understood by those skilled in the art that various changes in form and details may be made therein without departing from the spirit and scope of the invention.

What is claimed:

1. A light detector amplifier comprising a preamplifier circuit that is conducting in the quiescent state and has reduced conductivity in response to the sensing of incident light by a semiconductor photodiode, said semiconductor photodiode being connected to be reverse biased by said preamplifier circuit, current source and voltage clamping circuit means for supplying current to said preamplifier circuit that is diverted to said photodiode when illuminated by incident light, and a power amplifier circuit connected to be energized by the change of conductivity of said preamplifier circuit to produce an output indicative of sensed light.

2. A light detector amplifier wherein the combination defined in claim 1 energized by a low voltage supply, and further comprising an output circuit including a power device energized by another higher voltage supply, said output circuit being controlled by said power amplifier circuit.

3. A light detector amplifier according to claim 1 further including a pulse generator that is controlled by said power amplifier circuit and includes a thyristor device for producing a higher power output.

4. A light detector amplifier according to claim 1 in which said current source and voltage clamping circuit means incudes a constant current source connected to said preamplifier circuit and one terminal of said photodiode, and further includes a series connected resistance element and diode element also connected to said preamplifier circuit and photodiode terminal.

5. A light detector amplifier according to claim 1 in which said preamplifier circuit is a transistor circuit and said reverse biased photodiode is connected between base and emitter terminals of said transistor circuit, said transistor circuit comprising at least first and second transistors of which said first transistor is operated in the linear region and said second transistor is operated in the saturated region.

6. A light detector amplifier according to claim 1 in which said preamplifier circuit is a transistor circuit and said reverse biased photodiode is connected between base and emitter terminals of said transistor circuit, and said current source and voltage clamping circuit means includes a constant current source connected to said transistor circuit base terminal, and further includes a series connected resistance element and diode element also connected to said transistor circuit base terminal, and means for slightly forward biasing said diode element.

7. A high speed light detector amplifier comprising a transistor preamplifier circuit that is conducting in the quiescent state and has reduced conductivity in response to the sensing of incident light by a reverse biased semiconductor photodiode, said reverse biased semiconductor photodiode being connected between base and emitter terminals of said transistor preamplifier, said base terminal being a high impedance junction, current source and voltage clamping circuit means connected to said high impedance junction for supplying current to said preamplifier circuit that is diverted to said photodiode when illuminated by incident light, and for limiting voltage excursions of said high impedance junction, and a power amplifier circuit connected to be energized by current diverted when said preamplifier circuit changes conductivity to thereby produce a lower power output indicative of sensed light.

8. A light detector amplifier according to claim 7 in which said transistor preamplifier circuit comprises at least first and second transistors with the emitter of said first transistor connected to the base of said second transistor, said second transistor having a Schottky diode clamp between its base and collector to limit voltage excursions at said collector, said first transistor being operated in the linear region and said second transistor being operated in the saturated region.

9. A light detector amplifier according to claim 7 in which said reverse biased semiconductor photodiode has a low capacitance structure characterized by a patterned region of one conductivity type in the surface of a common layer of the opposite conductivity type.

10. A light detector amplifier according to claim 9 wherein said patterned region is the anode of said photodiode, said anode being connected to the lowest circuit potential.

11. A light detector amplifier according to claim 7 in which said current source and voltage clamping circuit means comprises a constant current source including a transistor connected to said high impedance junction, and further comprises a series connected resistor and diode element connected to said high impedance junction, and means for biasing said diode element to supply substantially greater current to said photodiode when illuminated than when not exposed to light.

12. A light detector amplifier according to claim 11 in which said constant current source transistor is a lateral split collector transistor with multiple, isolated collectors, one collector being connected to said high impedance junction.

13. A light detector amplifier according to claim 7 further including a pulse generator that is controlled by said power amplifier circuit and includes a thyristor device for producing a higher power output.

14. A light detector amplifier according to claim 13 in which said thyristor device is a lateral silicon controlled rectifier with a shorted cathode-gate structure for high dv/dt withstand capability.

15. A light detector amplifier according to claim 13 in which said power amplifier circuit comprises a high speed lateral transistor with a resistivity-graded base for generating a gating signal for said thyristor device.

16. A light detector amplifier according to claim 13 in which said power amplifier circuit comprises a plurality of transistors, and means for pre-biasing at least one of said transistors and limiting voltage excursions at the base of at least one of said transistors.

* * * * *